United States Patent [19]

Schade, Jr.

[11] 4,038,607
[45] July 26, 1977

[54] COMPLEMENTARY FIELD EFFECT TRANSISTOR AMPLIFIER

[75] Inventor: Otto Heinrich Schade, Jr., North Caldwell, N.J.

[73] Assignee: RCA Corporation, New York, N.Y.

[21] Appl. No.: 716,536

[22] Filed: Aug. 23, 1976

[51] Int. Cl.² .......................................... H03F 3/185
[52] U.S. Cl. ..................................... 330/13; 330/22; 330/35; 330/40
[58] Field of Search ................. 330/13, 22, 35, 40

[56] References Cited

U.S. PATENT DOCUMENTS

| | | | |
|---|---|---|---|
| 3,921,089 | 11/1975 | Tsurushima | 330/35 X |
| 3,974,455 | 8/1976 | Kamimura et al. | 330/35 X |
| 3,997,849 | 12/1976 | Thommen | 330/13 |

*Primary Examiner*—James B. Mullins
*Attorney, Agent, or Firm*—H. Christoffersen; A. L. Limberg; R. G. Coalter

[57] ABSTRACT

The quiescent current of a class A biased complementary field effect transistor amplifier is regulated by a bias network coupled to the gate electrodes of the output transistors which provides an offset voltage therebetween. When the amplifier supply voltage exceeds a minimum value, the bias network increases the offset voltage. Parameters of the network may be selected such that the change in offset voltage is greater than, less than or equal to the change in supply voltage. In the latter case the quiescent current is constant and the quiescent power dissipation is linearly related to the supply voltage.

5 Claims, 6 Drawing Figures

COMPLEMENTARY FIELD EFFECT TRANSISTOR AMPLIFIER

This invention relates to amplifiers and particularly to Class A biased complementary field effect transistor amplifiers.

Amplifiers are known which comprise an input terminal connected to the gate electrodes of a pair of complementary field effect transistors (FETS), an ouput terminal connected to the transistor drain electrodes and in which a supply voltage is applied across the transistor source electrodes. Such complementary FET amplifiers are widely used in digitial applications (as logic inverters, for example) and have the advantage that, in the quiescent state, substantially no quiescent current is conducted by the FETS so that power dissipation is exceedingly small regardless of the value of the supply voltage.

It is also known that such amplifiers may be biased for Class A operation to achieve linear amplification in analog applications. Customarily this is done by applying an input signal to the input terminal having a quiescent value equal to the average of the source electrode potentials. As an example, for a single ended supply, the input terminal would be quiescently biased at half the supply voltage. Assuming the transistors have reasonably well matched transfer characteristics, the aforementioned bias technique results in an equal distribution of the supply voltage across the FET drain to source channels and that is an optimum quiescent bias condition in that it tends to maximize the amplifier gain and dynamic range.

On the other hand, the range of supply voltages over which the Class A biased prior art amplifier can safely be operated has heretofore been relatively limited. The problem is that the quiescent current conducted by the FETS increases almost as the square of the supply voltage so that the quiescent power dissipation increases nearly as the cube of the supply voltage. That can lead to catastrophic failure due to excessive power dissipation. While such failure may be avoied by restricting the supply voltage to a relatively low value or employing relatively low transconductance FETS, such approaches do not solve the basic problem and limit the range of useful applications for the amplifier.

Another problem of the prior art amplifier in Class A operation concerns the quiescent and small singal dynamic output conductance, $Y_o$. For supply voltages, $V_s$, substantially greater than the sum of the FET threshold voltages, $Y_o$ is approximately linearly related to $V_s$ under quiescent and small signal conditions. In certain applications this can result in gain or slew rate variations which may be undesired.

The present invention is directed to meeting the need for a complementary field effect transistor amplifier operable over a wide range of supply voltages and in which the aforementioned problem of quiescent power dissipation is lessened and in which supply voltage dependent variations in output conductance may be reduced.

Figure 1:
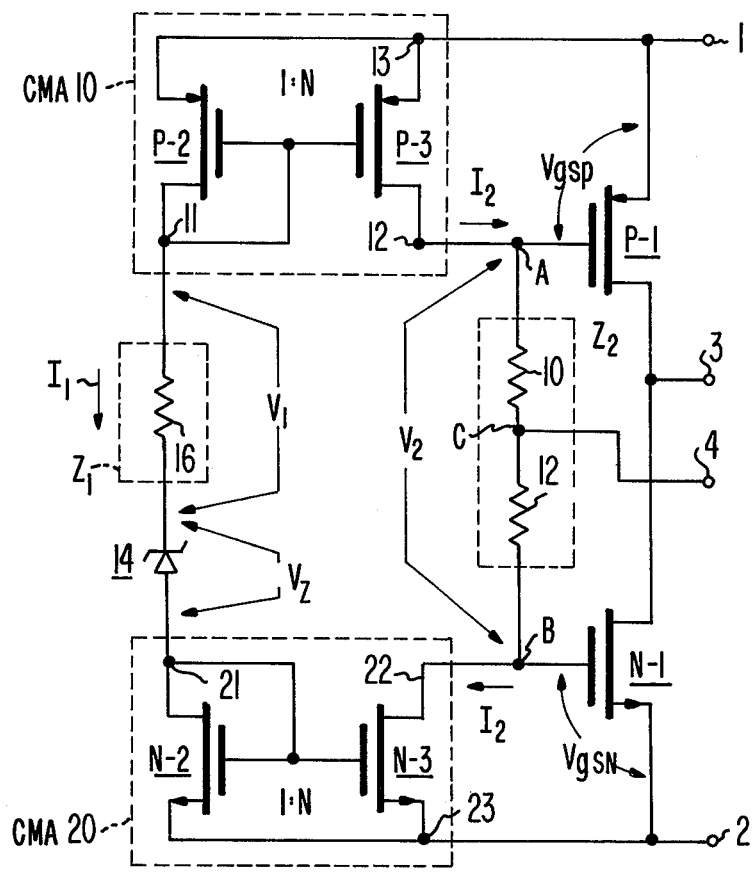
FIGS. 1 and 6 are circuit diagrams of amplifiers embodying the invention.

In FIG. 1 complementary field effect transistors P-1 and N-1 are connected at the source electrodes thereof, respectively, to supply terminals 1 and 2, at the drain electrodes thereof to output terminal 3 and at the gate electrodes thereof, respectively, to nodes A and B. These transistors are the amplifier output transistors and preferably are selected to have similar transconductances under similar bias conditions. The bias (that is, the gate-to-source voltage) of each output transistor is controlled by direct current conductive impedance $Z_2$ connected between nodes A and B which, under certain conditions, conducts a supply voltage dependent current $I_2$. Internally, impedance $Z_2$ comprises node C coupled to node A via resistor 10 and to node B via resistor 12.

A second purpose of impedance $Z_2$ is to provide direct coupling of input terminal 4 to the output transistor gate electrodes. Terminal 4 is connected to node C but may, alternatively, be connected any point on impedance $Z_2$, such as node A or node B, which allows amplification of direct current as well as alternating current input signals. Alternatively, a high pass transfer characteristic may be achieved by alternating current coupling the input signal to be amplified (i.e., via a capacitor) to any point on impedance $Z_2$ and applying a quiescent direct current bias to node C.

Current $I_2$ is supplied to node A via current mirror amplifier (CMA) 10 which is connected at the common terminal 13 and output terminal 12 thereof, respectively, to supply terminal 1 and node A. Internally, CMA 10 comprises a pair of P-channel field effect transistors P-2 and P-3 connected at the sources thereof to terminal 13, at the gates thereof to terminal 11 (which is the CMA 10 input terminal) and at the drains thereof, respectively, to terminals 11 and 12. The ratio, N, of the transconductance of transistor P-3 divided by that of transistor P-2 represents the current gain or "mirror ratio" of CMA 10, that is, $N = I_2/_1$, is the mirror input current and $I_2$ is the mirror output current. The value of N may be less than, greater than or equal to unity.

Current $I_2$ is withdrawn from node B via CMA 20 which is connected at the common terminal 23 and output terminal 22 thereof, respectively, to supply terminal 2 and node B. Internally, CMA 20 comprises a pair of N-channel field effect transistors N-2 and N-3 connected at the sources thereof to terminal 23, at the gates thereof to terminal 21 (which is the CMA 20 input terminal) and at the drains thereof, respectively, to terminals 21 and 22. The ratio of the transconductance of transistor N-3 divided by that of transistor N-2 represents the current gain $(I_2/_1)$ or mirror ratio of CMA 20 and preferably equals that of CMA 10, namely, N.

The same magnitude of input current $I_1$ passes through the input current paths of both current mirrors and through direct current condutive impedance $Z_1$ (resistor 16) and a threshold conduction device (Zener diode 14), $Z_1$ and 14 being connected in series between the CMA input terminals. (Diode 14 is connected at the anode thereof to terminal 21 and at the cathode thereof via resistor 16 to terminal 11). The purpose of resistor 16 and diode 14, in this example of the invention, is to control the magnitude of current $I_1$, to a first approximation, as a piece-wise linear dependent function of the supply voltage applied across terminals 1 and 2. In this regard, as will be explained, certain parameters of CMA's 10 and 20 may be selected relative to parameter of resistor 16 and diode 14 such that the input characteristics of the mirrors have a minimal or secondary effect on the magnitude of current $I_1$.

In operation, a supply voltage (which may vary over a range of values) is applied across terminals 1 and 2 with terminal 1 being at the more positive potential. To simplify the explanation, it will be assumed that terminal 2 is maintained at a reference potential such as ground (i.e., zero volts) and that a positive supply voltage, $V_s$, is applied to terminal 1. It will also be assumed, regardless of the magnitude of $V_2$, that input terminal 4 is quiescently biased (from an external souce, not shown,) at a voltage, $V_{IN}$, equal to the average of the potentials of terminals 1 and 2. Thus, under the previous assumption, the quiescent value of $V_{IN}$ is $V_s/2$.

Since the gate is connected to the drain of transistor N-2, no current can flow through the conduction path thereof unless the voltage thereacross is greater than some minimum value, namely, its threshold voltage, $V_t$ (N-2). The same is true of transistor P-2 which has a threshold voltaged $V_t$ (P-2). Since the source-drain paths of these transistors are connected in series with Zener diode 14 (which has a Zener voltage, $V_z$, across supply terminals 1 and 2, it follows that no current can flow in that series path when:

$$V_s < V_t(P\text{-}2) + v_t(N\text{-}2) + V_z \quad (1)$$

Thus, when inequality 1 is satisfied, the current $I_1$ is zero and since $I_1$ is the input current of CMA's 10 and 20, $I_2$ is also zero regardless of the value of the mirror ration, N. Since $I_2$ flows through impedance $Z_2$ and is zero, the voltage developed thereacross (hereafter, the gate offset voltage $V_2$) will be zero and the voltages at nodes A, B and C will equal that applied to input terminal 4, which is $V_s/2$ in the quiescent state under the given assumptions. Accordingly, the magnitudes of the gate-to-source voltage, $V_{gsp}$ and $V_{gsn}$, of output transistors P-1 and N-1, respectively, will each equal $V_s/2$.

If $V_{gsp}$ is greater than the threshold voltage $V_t$(P-1) of transistor P-1 and if $V_{gsn}$ is greater than the threshold voltage of transistor N-1, it follows that the outpu transistors P-1 and N-1 can simultaneously conduct current if:

$$V_t(P\text{-}1) + V_t(N\text{-}1) < V_s \quad (2)$$

In equalitites 1 and 2 may be combined to yield:

$$V_t(P\text{-}1) + V_t(N\text{-}1) < V_s < V_t(P\text{-}2) + V_t(N\text{-}2) + V_z \quad (3)$$

Inequality 3 defines a range of $V_s$ over which the transcoanductance of each output transistor increases as $V_s$ increases. This results because in this range $V_2$ (the voltage acrosss $Z_2$) is zero so that an increas in $V_s$ causes a proportional increase in the quiescent values of $V_{gsp}$ and $V_{gsn}$. Because of this, the quiescent and small signal dynamic output conductance, $Y_o$, increases with an increase in $V_s$. The voltage gain, $A_v$, also increases as $V_s$ increases and the quiescent current, $I_q$, increases at a rate approaching the square of $V_s$. Since quiescent power dissipation, $P_d$, is equal to the product of the quiescent current and the supply voltage, $P_d$ varies at a rate approaching the cube of $V_s$. These functional dependencies all change, however, to provide numerous advantages when:

$$V_s > V_t(P\text{-}2) + V_t(N\text{-}2) + V_z \quad (4)$$

Inequality 4 defines the range of $V_s$ in which derivatives with respect to $V_s$ of $A_v$, $Y_o$, $I_q$ and $P_d$ may be controlled in a desired manner by appropriate selection of the mirror ratio N and the ratio of the real componenets of impedances $Z_1$ and $Z_2$. Three possible relationships of $Z_1$, $Z_2$ and N are:

$$Z_1 \text{(real)}/Z_2 \text{(real)} = N \quad (5)$$
$$Z_1 \text{(real}/Z_2 \text{(real)} < N \quad (6)$$
$$Z_1 \text{(real)}/Z_2 \text{(real)} > N \quad (7)$$

If $Z_1$, $Z_2$ and N are selected to satisfy equation 5 then (in the range defined by inequality 4), $A_v$, $Y_o$, $I_q$ may essentially be independent of $V_s$ and $P_d$ may vary substantially linearly as $V_s$ varies. Circuit operation in this condition is most easily understood by considering the following specific example.

Assume that the value of resistor 16 is equal to the sum of the values of resistors 10 and 12 and that the mirror ratio N is unity so that equation 5 is satisfied. To simplify the discussion assume also that the value of resistor 16 is substantially greater than the sum of the reciprocals of the transconductances of transistors P-2 and N-2 plus the dynamic resistance of Zener diode 14. This latter assumption, stated another way, is that the value of resistor 16 is larger than the total impedance of the other elements through which current $I_1$ flows so that resistor 16 serves, in effect, as the principal current limiting element for current $I_1$. To further simplify the discussion, assume that the sum of the incremental drain-to-source voltage variations of transistors P-2 and N-2 caused by changes in current $I_1$ is negligibly small as compared to the sum of their threshold voltages plus the Zener voltage $V_z$ of diode 14. By this assumption, the sum of the drain-to-source voltages of transistors P-2 and N-2 plus $V_z$ may be considered, for purposes of determining the voltage $V_1$, as a constant, K, having a value only slightly greater than $V_z + V_t$ (P-2) + $V_t$ (N-2).

Under the above conditions, the voltage $V_1$ will equal $V_2 - K$. Since N is unity and impedances $Z_1$ and $Z_2$ are equal, the currents $I_1$ and $I_2$ will be equal and the voltages $V_1$ and $V_2$ will be equal so that $V_2$ may be expressed as $V_s - K$. Since the sum of the gate-to-source voltages ($V_{gsn} + V_{gsp}$) of the output transistors plus $V_2$ equals the supply voltage, $V_s$, it follows that $$V_{gsn} + V_{gsp} = K \quad (8)$$

From equation 8 it is apparent that the gate-to-source voltages of transistors P-1 and N-1 are constant and thus independent of the supply voltage $V_s$. Since it is assumed that resistors 10 and 12 are of the same value and that input terminal 4 is quiescently biased at $V_s/2$, the gate-to-source voltages of the output transistors will thus be equal under quiescent conditions regardless of the actual value of $V_s$ as long as inequality 4 is satisfied. The effect of this upon the derivatives of $A_v$, $I_q$, $Y_o$ and $P_d$ may be appreciated by considering the following two equations which represent the dependence of transconductance, gm, and drain current, $I_d$, upon gate-to-source voltage, $V_g$, of a field effect transistor operating in the saturation region of its drain characteristics.

$$gm = C(V_g - V_t) \quad (9)$$
$$I_d = (C/2)(V_g - V_t)^2 \quad (10)$$

In equations 9 and 10, C is a process constant dependent on parameters such as carrier mobility, oxide dielectric constant, oxide thickness and physical dimensions (width to length ratio) of the transistor. From these equations it is seen the transconductance and drain current of transistor P-1 and N-1 would increase for an increase in $V_s$ if $V_{gsp}$ and $V_{gsn}$ were dependent (as in the prior art amplifier) on $V_s$. But from equation (8), $V_{gsn}$ and $V_{gsp}$ are inependent of $V_s$ under the given conditions. Because of this, parameters such as $A_v$, $Y_o$ and $I_d$ (which are direct functions of $gm$) are also constant. The only parameter which remains a function of $V_s$ is $P_d$ which equals the product of $V_s$ and $I_d$. Since $I_d$ is constant $P_d$ will vary linearly with $V_s$. By this latter feature the amplifier of FIG. 1 may be operated over a much wider range of supply voltages than the prior art amplifier in which $P_d$ varies nearly as the cube of $V_s$.

Thus far the discussion has concerned the advantages of circuit operation under the conditions of equation 5. Other modes of operation may be obtained by selection of parameter values such that inequalities 6 to 7 are satisfied. As an example, under the conditions suggested by inequality 6, a given incremental change in $V_s$ will cause a greater incremental change in $V_2$ occur. Thus, the sum of the gate-to-source voltages of the output transistors will decrease as $V_s$ increases. A limiting value of $V_s$ will be reached where the sum of the gate-to-source voltages of the ouput transistors is not greater than the sum of their threshold voltages. When that happens transistors P-1 and N-1 cannot be simultaneously conductive, no quiescent current will flow through their source-drain paths, and the power dissipation will become zero. Stated another way, under the conditions of inequality 6, the amplifier is self-protecting and will automatically cease operation in the event of an overvoltage condition.

Another effect may be achieved by selection of parameters to satisfy inequality 6. In that case a given incremental change in $V_s$ will result in a smaller incremental change in the voltage $V_2$ so that the gate-to-source voltages of the output transistors will increase as $V_s$ increases at a rate which may be precisely controlled by varying $Z_1$, $Z_2$ or N.

Figure 2:
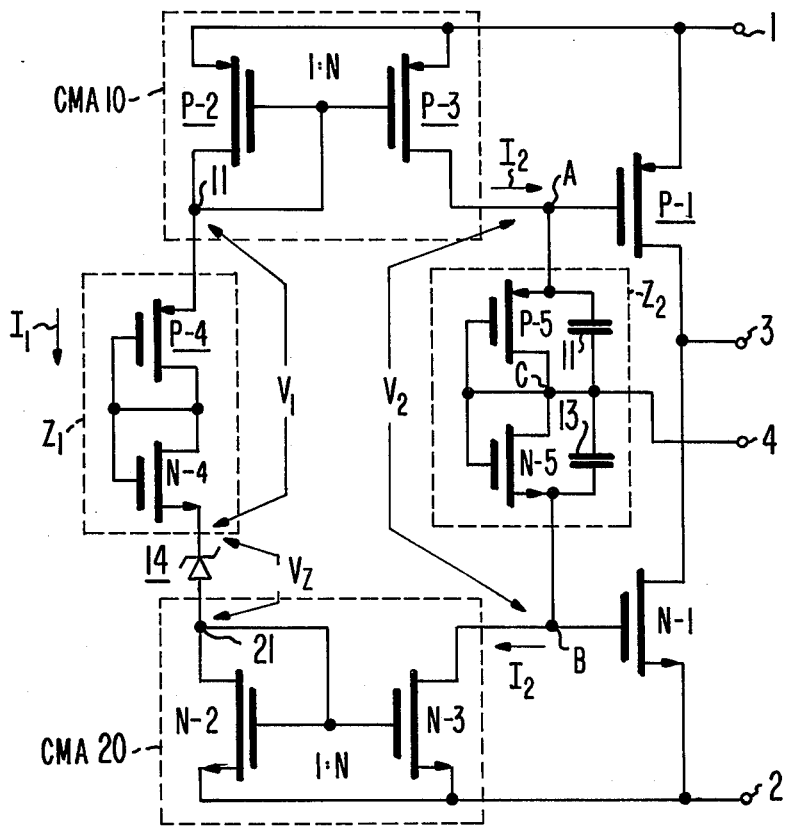
FIGS. 2-4 are circuit diagrams illustrating modifications of the circuit of FIG. 1.

In the discussion to this point, it has been assumed that impedances $Z_1$ and $Z_2$ are a purely real (i.e., not complex) and linear. As an alternative, these impedances may be complex and nonlinear to achieve not only the advantages previously discussed but additional benefits as well. FIG. 2 shows how this may be done.

In FIG. 2 resistor 16 in impedance $Z_1$ has been replaced by a nonlinear impedance comprising transistors P-4 and N-4 which are connected as forward biased diodes in series with Zener diode 14 between the input terminals 11 and 21 of CMA's 10 and 20, respectively. In impedance $Z_2$ resistors 10 and 12 have been replaced by diode-connected field effect transistors P-5 and N-5, respectively. Additionally, capacitors 11 and 13 are connected from node C to nodes A and B, respectively.

Thus modified, the amplifier of FIG. 2 offers numerous advantages. For example, resistors have been totally eliminated from the circuit. This feature makes implementation of the amplifier in integrated circuit form more economical since integrated resistors may require a relatively large amount of chip area in an integrated circuit as compared with integrated transistors. A further advantage is that the phase shift (which may be troublesome in certain closed loop applications) has been reduced and the frequency response (which may be important in certain wide band or high frequency applications) has been extended. These latter features, as will be explained, are provided by capacitors 11 and 13. Moreover, these advantages are achieved without a sacrifice in the advantages of the previous circuit.

Operation of the modified circuit is, in many respects, substantially the same as that of FIG. 1 in the squiescent state and for low frequency input signals. The voltage $V_1$, for example, is equal to the supply voltage $V_s$ minus constant K where K = the sum of the Zener voltage $V_2$ of diode 14 plus the threshold voltages of transistor P-2 and N-2. Current $I_1$, of course, is not a linear function of voltage $V_1$ because the current/voltage transfer characteristics (hereafter I/V) of diode connected transistors P-4 and N-4 are non-linear. Since current mirror amplifiers CMA 10 and 20 are linear amplifiers, the current $I_2$ will be directly proportional to the current $I_1$. Therefore, current $I_2$ will also be non-linear but since diode connected transistors P-5 and N-5 are also non-linear devices and conduct current $I_2$, it follows that a relationship may be found between transistors P-4 and N-4, P-5 and N-5 such that voltage $V_2$ will be linearly dependent on voltage $V_1$. Stated another way, the non-linearities of impedances $Z_1$ and $Z_2$ may, in effect, be cancelled by appropriate selection of parameters of transistors P-4, N-4, P-5 and N-5 and the mirror ratio N. As an example, assume that N = unity and that the transconductances of transistors P-4, N-4 and P-5 and N-5 are all equal. Under this condition, impedances $Z_1$ and $Z_2$ will have similar I/V transfer characteristics and since they will conduct identical currents ($I_1 = I_2$) the voltage $V_2$ will equal voltage $V_1$ notwithstanding non-linearities in the impedances.

Another difference in the quiescent and low frequency operation of the modified amplifier compared to that of FIG. 1 is that additional terms must be added to certain of the previous equations to account for the two additional threshold voltages introduced in the circuit by the inclusion of transistors P-4 and N-4. The right hand side of equation 4, for example, which specifies the value of the supply voltage $V_s$ at which current $I_1$ just begins to flow, would include two additional terms, namely the threshold voltages of transistors p-4 and N-4.

Capacitors 11 and 13, as mentioned, reduce the phase shift and increase the frequency response of the modified amplifier by providing a low impedance path for alternating signal components between input terminal 4 and nodes A and B. This effectively reduces the overall effect of the inherent capacities of nodes A and B which would otherwise form, in effect, a low pass filter having a time constant directly proportional to the nodal capacitance and inversely proportional to the transconductances of the diode connected transistors in impedance $Z_2$. The same effect may occur in the amplifier of FIG. 1 where the time constant is directly dependent upon the nodal capacitances and the values of resistors 10 and 12. Resistors 10 and 12 in the amplifier of FIG. 1 may be bypassed by capacitors as in FIG. 2 to improve its frequency response and reduce its phase shift.

Figure 3:
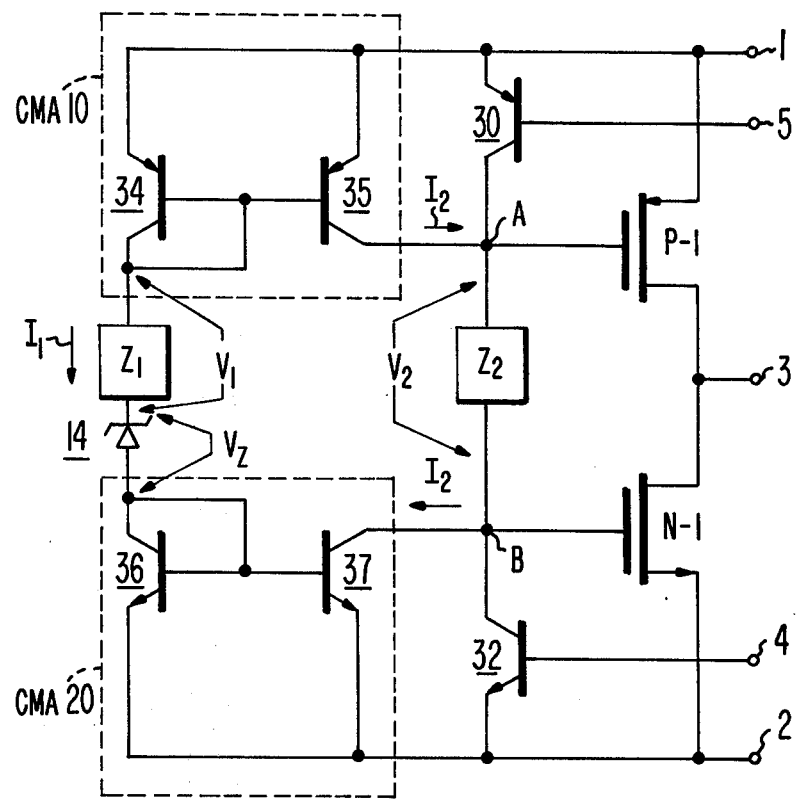

In FIGS. 1 and 2 it was shown how the input signal might be applied directly to a point on impedance $Z_2$. An additional advantage of increased gain may be achieved by applying the input signal indirectly to points on impedance $Z_2$ as shown in FIG. 3, where impedances $Z_1$ and $Z_2$ are represented in block diagram form for simplicity. As previously explained those impedances may be linear or non-linear and complex or non-complex. Field effect transistors P-2 and P-3 of CMA 10 have been replaced by bipolar transistors 34 and 35 and transistors N-2 and N-3 in CMA 20 have been replaced by bipolar transistors 36 and 37, respectively. Input terminal 4 rather than being coupled directly to a point on impedance $Z_2$ is instead connected to the base of NPN transistor 32 which is connected at the emitter and collector eleectrodes thereof to terminal 2 and node B, respectively. An additional input terminal 5 is connected to the base of a PNP transistor 30 which is connected at the emitter and collector electrodes thereof to terminal 1 and node A, respectively.

As a result of the change from field effect transistors to bipolar transistors in current mirror amplifiers 10 and 20, the minimum value of $V_s$ at which current $I_1$ begins to flow will be equal to:

$$V_2 = V_z + V_{BE}(34) + V_{BE}(36) \qquad (11)$$

The terms $V_{BE}(34)$ and $V_{BE}(36)$ in this equation refer to the forward biased base-emitter voltage drops of transistors 34 and 36, respectively. Typically, for silicon transistors $V_{BE}$ will be only a few hundred millivolts. If $V_z$ is equal to a few volts, $V_{BE}$ of transistors 34 and 36 may be ignored so that to a good approximation:

$$V_1 \approx V_s - V_z \qquad (12)$$

Under the previous assumption that the mirror ratio N is unity and that the real components of impedances $Z_1$ and $Z_2$ are similar, the voltage $V_2$ will include a component equal to the supply voltage $V_s$ minus (in this case) $V_z$.

Voltage $V_2$, in this case, will include a further component as a result of current supplied to node A via transistor 30 and withdrawn from node B via transistor 32. Assume, for example, that input terminal 5 is biased at a fixed voltage level with respect to supply terminal 1 such that transistor 30 supplies a constant current to node A and that an input signal to be amplified is applied to input terminal 4. Under these conditions, transistor 30 operates as a "constant current source" and serves in effect as the principal load impedance for transistor 32 which operates as an amplifier. The overall circuit gain is thus increased by an amount equal to the transconductance of transistor 32 multiplied by the resistance of its effective load.

The gain may be increased even further by applying the input signal simultaneously to input terminals 4 and 5. This can be done, for example, by providing separate direct current bias circuits for terminals 4 and 5 and alternating current coupling the input signal to both terminals. If it is done, a form of push-pull operation is achieved whereby transistors 30 and 32, in effect, each serves as an active load impedance for the other thereby greatly increasing the overall circuit gain.

As previously mentioned, the currents conducted by transistors 30 and 32 flow through impedance $Z_2$ and thereby cause an additional component of voltage $V_2$ to be produced. By appropriate selection of impedance $Z_2$ and the quiescent bias of transistors 30 and 32, this additional conponent may be made relatively small as compared with the principle component of $V_2$ due to current $I_2$. Thus the relationships previously discussed of the gate offset voltage $V_2$ and the supply voltage $V_s$ may be applied also to this example of the invention. That is, value of $Z_1$, $Z_2$ and N may be selected such that $V_{gsp} + V_{gsn}$ is constant when the supply voltage $V_s$ exceeds a given value.

Figure 4:
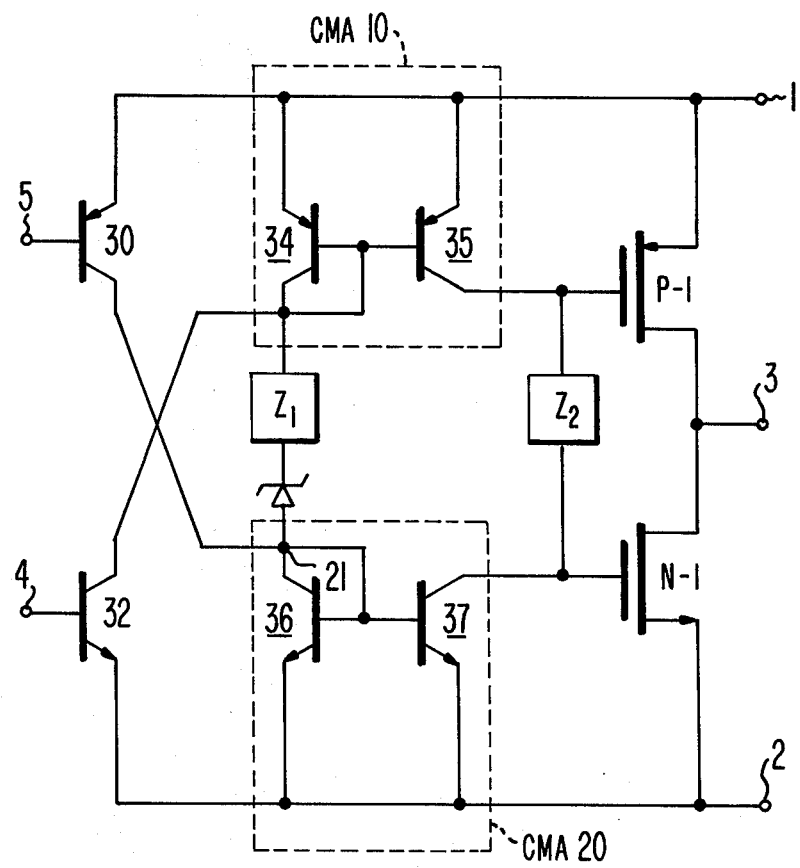

FIG. 4 is similar to FIG. 3 except that the collector of transistor 30 is connected to input terminal 21 of CMA 20 and the collector of transistor 32 is connected to input terminal 11 of CMA 10. This modification illustrates a further method of applying input signals to impedance $Z_2$. Circuit operation is substantially the same as that of FIG. 3 except that, since the collector currents are applied via the CMAs to impedance $Z_2$, the collector-to-emitter voltages of transistors 30 and 32 do not vary appreciably as the input signal changes so that the Miller effect, insofar as transistors 30 and 32 are concerned, is greatly reduced.

Figure 5:
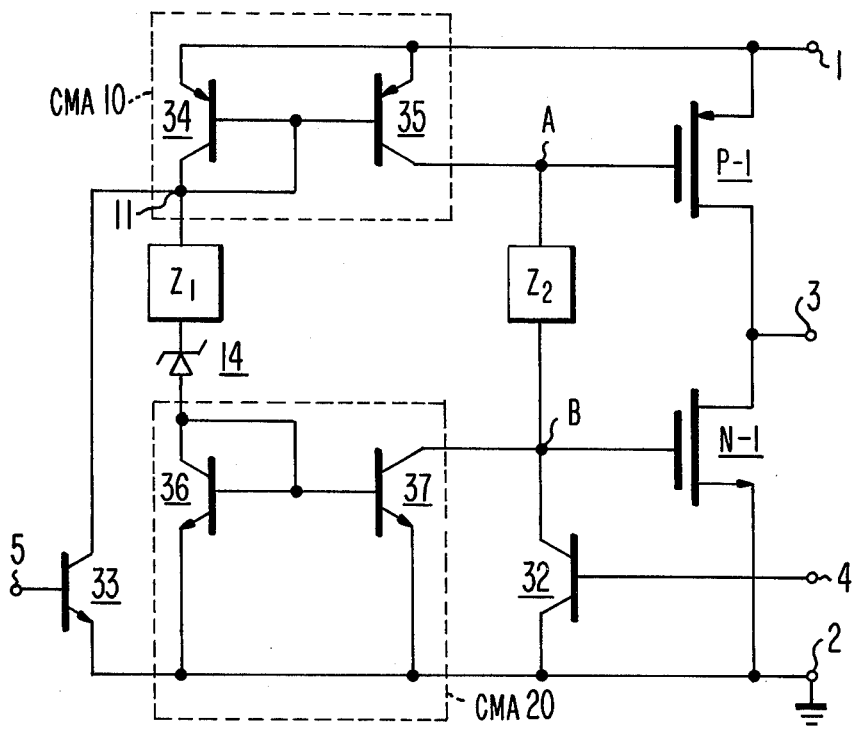

In the amplifier of FIG. 5, transistor 32 is connected as in FIG. 3 and an additional NPN transistor 33 is connected at the emitter, base and collector electrodes thereof to terminal 2, terminal 5 and input terminal 11 of CMA 10. By this modification the advantages of additional gain provided by the added bipolar transistors is achieved and additionally the amplifier may be used for amplifying differential input signals and rejecting common node input signals.

Impedances $Z_1$ and $Z_2$ and CMA's 10 and 20 operate as previously described to maintain the gate to source voltages ($V_{gsp} + V_{gsn}$) of the output transistors constant when supply voltage $V_s$ is greater than a given value. Transistor 32 withdraws a current from node B in direct proportion to an input signal applied to terminal 4. Transistor 33, by means of CMA 10, supplies current to node A in direct proportion to an input signal applied to input terminal 5. Thus, for a common mode component of the input signals applied to terminals 4 and 5, the currents supplied to node A and withdrawn from node B will be equal. Thus, the average of the node A and B potentials is independent of the magnitude of the common mode component. On the other hand, for differential mode input signals, the current supplied to node A will differ from that withdrawn from node B thereby causing the average of the node A and B potentials to vary in accordance with the differential input signals.

Figure 6:
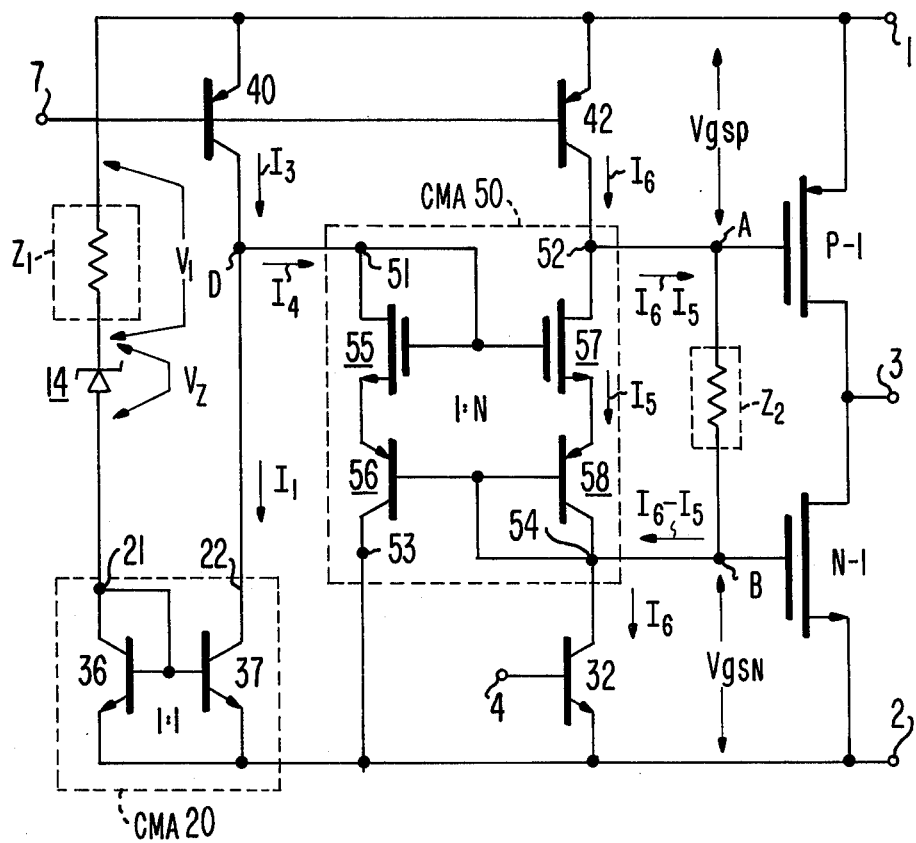

In the amplifier of FIG. 6, transistors P-1 and N-1, impedances $Z_2$ and $Z_1$, diode 14 and current mirror amplifier 20 are connected as previously described. While the remainder of the circuit differs in several respects from the previous examples, it will be seen that similar advantages and features are achieved by appropriate selection of circuit elements (i.e., the values of impedances $Z_1$ and $Z_2$ and a mirror ratio,) in the manner already discussed.

In more detail, in FIG. 6 the output of CMA 20 (which will be assumed to be a unity gain CMA) is connected to node D, to the collector of a PNP transistor 40 and to input terminal 51 of CMA 50. The base and emitter electrodes of transistor 40 are connected respectively to a bias terminal 7 and supply terminal 1. Bias terminal 7 is also connected to the base of a PNP transistor 42 which is connected at the emitter and collector electrodes thereof to supply terminal 1 and output terminal 52 of CMA 50, respectively. Terminals 53 and 54 of CMA 50 are connected, respectively, to supply terminal 2 and to the collector of NPN transistor 32 which is connected at the base and emitter electrodes thereof, respectively, to input terminal 4 and supply terminal 2. Nodes A and B are connected respectively to terminals 52 and 54 of CMA 50.

In operation, when the supply voltage $V_s$ at terminal 1 is greater than the Zener voltage $V_z$ of diode 14, current $I_1$ flows into input terminal 21 of CMA 20. Since it is assumed that CMA 20 is of unity gain, transistor 37 withdraws a current equal to $I_1$ from node D. A bias voltage applied to terminal 7 causes transistor 40 to supply a fixed current $I_3$ (which is normally greater than $I_1$) to node D. Since current $I_3$ is constant and $I_1$ increases as $V_s$ increases a difference current $I_4$ is supplied from node D to input terminal 51 of CMA 50 which decreases as $V_s$ increases.

CMA 50 is a "four terminal" current mirror amplifier having an input path including transistors 55 and 56 coupled between terminals 51 and 53 and an output path including transistors 57 and 58 coupled between output terminals 52 and 54. The flow of current $I_4$ in the input path of CMA 50 controls the flow of current in the output path in accordance with the ratio of transconductances of the input transistors (55 and 56) as compared with the transconductances of the output transistors (57 and 58). The transistor may be selected to achieve a value of current gain or mirror ratio N. Thus, the current $I_5$ conducted by transistors 57 and 58 in the output path of CMA 50 equals N times the difference current $I_4$ conducted by transistors 55 and 56 in the input path of CMA 50.

Transistor 42 having its base connected to bias terminal 7 supplies a constant current $I_6$ to terminal 52 of CMA 50. Transistor 32 receives input signals at the base electrode thereof and withdraws, quiescently, current $I_6$ from terminal 54 of CMA 50. Since the output path of CMA 50 can only conduct a current equal to $I_5$, a difference current equal to $I_6 - I_5$ is supplied to node A and withdrawn from node B. By selection of the values of impedances $Z_1$ and $Z_2$ and the mirror ratio of CMA 50, the difference current ($I_6 - I_5$) which flows through impedance $Z_2$ may be made equal to current $I_1$ and the voltage $V_2$ across impedance $Z_2$ may be made equal to the voltage $V_1$ across impedance $Z_1$. Since $V_1$ equals the supply voltage $V_s$ minus a constant, the sum of the gate-to-source voltages of output transistors P-1 and N-1 ($V_{gsp} + V_{gsn}$) will thus be constant. Thus, under the assumed conditions, parameters such as voltage gain, output conductance and quiescent current will be substantially independent of $V_s$ and power dissipation will be substantially linearly dependent on $V_s$ in the range where $V_s$ is greater than $V_z$.

What is claimed is:

1. An amplifier, comprising:
   first and second supply terminals for receiving a supply voltage, $V_s$, thereacross which may vary over a voltage range;
   an output terminal;
   a pair of complementary field effect transistors, one transistor being connected at the source and drain electrodes thereof, respectively, to said first supply terminal and said output terminal, the other transistor being connected at the source and drain electrodes thereof, respectively, to said second supply terminal and said output terminal, each transistor having a gate electrode;
   a direct current conductive impedance connected between said gate electrodes;
   input means for applying an input signal to be amplified to at least one point on said impedance;
   a first current mirror amplifier having a common terminal coupled to said first supply terminal, an output terminal coupled to said gate electrode of said one transistor and having also an input terminal;
   a second current mirror amplifier having a common terminal coupled to said second supply terminal, an output terminal coupled to said gate electrdoe of said other transistor, and having also an input terminal; and
   a current path coupled between said input terminals of said first and second current mirror amplifiers for conducting a first current therebetween when $V_s$ is greater than a minimum value, said current path including a series connection of a further impedance and a threshold conduction device.

2. An amplifier, comprising:
   first and second supply terminals for receiving a supply voltage, $V_s$, thereacross which may vary over a voltage range;
   an output terminal;
   a pair of complementary field effect transistors, one transistor being connected at the source and drain electrodes thereof, respectively, to said first supply terminal and said output terminal, the other transistor being connected at the source and drain electrodes thereof, respectively, to said second supply terminal and said output terminal, each transistor having a gate electrode;
   a direct current conductive impedance connected between said gate electrodes;
   input means for applying an input signal to be amplified to at least one point on said impedance;
   a current path coupled between said supply terminals for conducting a first current therebetween when $V_s$ is greater than a minimum value, said current path including a series connection of a further impedance and a threshold conduction device;
   means responsive to said first current for producing an inversely varying second current; and
   four terminal current mirror amplifier means having an input path for receiving said second current and an output path coupled in parallel with said direct current conductive impedance.

3. An amplifier comprising:
   first and second supply terminals for receiving a supply voltage, $V_s$, thereacross which may vary;
   a series path coupled between said supply terminals for conducting a first current, $I_1$, therebetween when $V_s$ is greater than a minimum value, said series path including a first direct current conductive impedance, $Z_1$, and a threshold conduction device;
   first and second nodes;
   circuit means responsive to said first current for supplying a second current having a value $NI_1$ to one of said nodes and withdrawing said second current from the other of said nodes; said circuit means including a first current mirror amplifier having a mirror ratio equal to N, a common terminal connected to said first supply terminal, an output terminal connected to said first node and an input terminal connected to one end of said series path; and a second current mirror amplifier having a mirror ratio equal to N, a common terminal connected to said second supply terminal, an output teminal connected to said second node and input terminal connected to the other end of said series path;
   a second direct current conductive impedance, $Z_2$, connected between said nodes for conducting said second current therebetween and for producing a voltage thereacross;
   an output terminal;
   a P-channel field effect transistor having source, gate and drain electrodes connected, respectively, to said first supply terminal, said first node and said output terminal;
   an N-channel field effect transistor having source, gate and drain electrodes connected, respectively, to said second supply terminal, said second node and said output terminal; and input means for applying an input signal to be amplified to at least one point on a selected one of said first and second impedances.

4. The amplifier recited in Claim 3 wherein said input means comprises:

first and second complementary transistors, each having a conduction path and a control electrode, the conduction path of the first transistor being connected between said first supply terminal and said input terminal of said second current mirror amplifier, the conduction path of the second transistor being connected between said second supply terminal and said input terminal of said first current mirror amplifier; and means for applying said input signal to the control electrode of at least one of said complementary transistors.

5. An amplifier comprising:

first and second supply terminals for receivng a supply voltage, $V_s$, thereacross which may vary;

a series path coupled between said supply terminals for conducting a first current, $I_1$, therebetween when $V_s$ is greater than a minimum vlaue, said series path including a first direct current conductive impedance, $Z_1$, and a threshold conduction device; first and second nodes;

circuit means responsive to said first current for supplying a second current having a value $NI_1$ to one of said nodes and withdrawing said second current from the other of said nodes; said circuit means including means responsive to said first current for producing an inversely related control current; and a four terminal current mirror amplifier having an input path for receiving said control current and an output path connected in parallel with said second impedance;

a second direct current conductive impedance, $Z_2$, connected between said nodes for conducting said second current therebetween and for producing a voltage thereacross;

an output terminal;

a P-channel field effect transistor having source gate and drain electrodes connected, respectively, to said first supply terminal, said first node and said output terminal;

an N-channel field effect transistor having source, gate and drain electrodes connected, respectively, to said second supply terminal, said second node and said output terminal; and input means for applying an input signal to be amplified to at least one point on a selected one of said first and second impedances.

* * * * *